United States Patent [19]

Medico

[11] Patent Number: 4,553,311
[45] Date of Patent: Nov. 19, 1985

[54] CHUCK HANDLING DEVICE

[75] Inventor: Louis J. Medico, Wilton, Conn.

[73] Assignee: The Perkin-Elmer Corporation, Norwalk, Conn.

[21] Appl. No.: 564,266

[22] Filed: Dec. 22, 1983

[51] Int. Cl.⁴ .................... B23Q 7/00; B25B 11/00; B65G 15/64

[52] U.S. Cl. .................................... 29/559; 269/21; 198/345

[58] Field of Search ............... 198/345; 269/289 R, 269/900, 21, 58; 29/559

[56] References Cited

U.S. PATENT DOCUMENTS

| | | | |
|---|---|---|---|
| 2,969,004 | 7/1976 | Schliemann | 269/21 |
| 3,990,689 | 11/1976 | Eklund | 269/21 |
| 4,258,928 | 3/1981 | Wiesler | 269/21 |
| 4,449,885 | 5/1984 | Hertel et al. | 198/345 |
| 4,500,032 | 2/1985 | Ackerman | 198/345 |
| 4,504,045 | 3/1985 | Kenbo et al. | 269/21 |

Primary Examiner—Howard N. Goldberg
Assistant Examiner—Steven Nichols
Attorney, Agent, or Firm—Thomas P. Murphy; Edwin T. Grimes; Francis L. Masselle

[57] ABSTRACT

This invention is related to method and devices for applying and holding a wafer chuck assembly against an X, Y, θ alignment plate, said system including latching a wafer chuck assembly with a chuck handling device while inserting alignment pins carried by the device into corresponding V-like grooves in the chuck assembly to form a rigid unit, mounting the unit on pins extending from the X, Y, θ alignment plate, releasing the latching to allow the chuck assembly to fall downwardly a short distance until it rests on the X, Y, θ pins, and extending two pistons from the chuck handling device to engage the wafer chuck assembly to urge it snugly against the X, Y, θ alignment plate until the chuck assembly and alignment plate are locked together by vacuum means.

7 Claims, 3 Drawing Figures

CHUCK HANDLING DEVICE

FIELD OF INVENTION

This invention relates to microlithography systems and, more particularly, to a chuck handling device for use in such systems.

BACKGROUND OF THE INVENTION

In the fabrication of integrated circuits the silicon wafers on which circuits are formed must under go a large number of processing steps. For example, each wafer must be coated, exposed, developed, etched and recoated many times as the integrated circuits on the wafers are built up layer by layer. For facilitating alignment and movement of the wafer through the processing steps, the wafer is mounted on a wafer chuck assembly and brought into contact with an X, Y, $\theta$ alignment plate. The X, Y, $\theta$ plate is continuously supported by precision air bearings to provide substantially zero-friction operation necessary for sub-micron adjustments. Typically the plate is driven in the X, Y, $\theta$ coordinates by 3 stepping motors linked to the plate by appropriate gear packages and linkage assemblies. When correct alignment has been established, brakes are applied to lock the plate in the desired position.

An object of the present invention is to apply a small known, repeatable, force to the wafer chuck assembly during the establishment of a vacuum between the X, Y, $\theta$ plate and the wafer chuck assembly. The device and method of the present invention eliminates the many difficulties previously encountered in controlling the magnitude and adjustment of the forces necessary to obtain a proper wafer chuck hold-down operation.

Another object of the invention is to reduce the hold-down time, thereby increasing the wafer throughput.

SUMMARY OF THE INVENTION

In order to accomplish the desired results, the invention provides, in a microlithography system having a wafer chuck assembly for holding a wafer while it is being processed, a chuck handling device which is characterized by a main body having a front side and a rear side, latch means mounted on the front side of the main body for latching the wafer chuck assembly, pin means extending from the front side of said main body for engaging corresponding grooves in the wafer chuck assembly, and a pair of pistons and cylinder assemblies mounted in spaced relationship with respect to each other for extending from the front side of the main body to engage the wafer chuck assembly with a precision, repeatable force.

In another form of the invention, there is provided in a microlithography system, a method of applying and holding a wafer chuck assembly against an X, Y, $\theta$ alignment plate which includes the steps of: latching a wafer chuck assembly with a chuck handling device while inserting alignment pins carried by the device into corresponding V-like grooves in the chuck assembly to form a rigid unit; mounting the unit on pins extending from the X, Y, $\theta$, alignment plate; releasing the latching to allow the chuck assembly to fall downwardly a short distance until it rests on the X, Y, $\theta$ pins; and extending two pistons from the chuck handling device to engage the wafer chuck assembly to urge it snugly against the X, Y, $\theta$ alignment plate until the chuck assembly and alignment plate are locked together by vacuum means.

There has thus been outlined rather broadly the more important features of the invention in order that the detailed description thereof that follows may be better understood, and in order that the present contribution to the art may be better appreciated. There are, of course, additional features of the invention which will be described hereinafter and which will form the subject of the claims appended hereto. Those skilled in the art will appreciate that the conception upon which the disclosure is based may readily be utilized as a basis for the designing of other devices and methods for carrying out the several purposes of the invention. It is important, therefore, that the claims be regarded as including such equivalent devices and methods as do not depart from the spirit and scope of the invention.

Several embodiments of the invention have been choosen for purposes of illustration and description and are shown in the accompanying drawings, forming a part of the specification.

DETAILED DESCRIPTION OF THE PRESENTLY PREFERRED EMBODIMENTS

Figure 1:
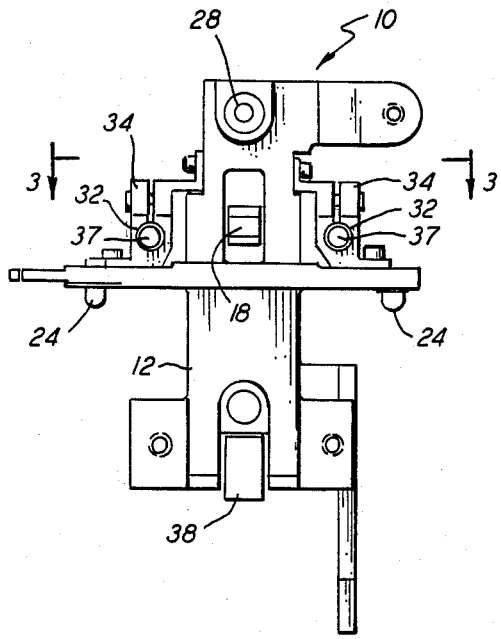
FIG. 1 is a front elevation of a chuck handling device constructed according to the concepts of the present invention.
Figure 2:
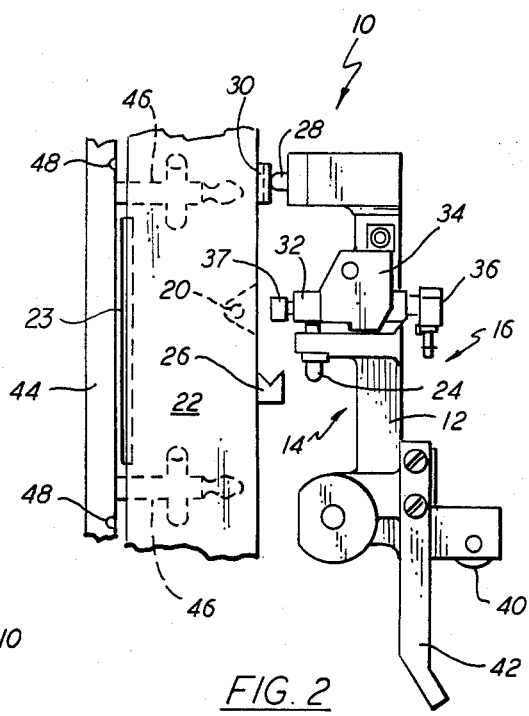
FIG. 2 is a side elevation of the device of FIG. 1, disposed adjacent a wafer chuck assembly and an X, Y, $\theta$ alignment plate.
Figure 3:
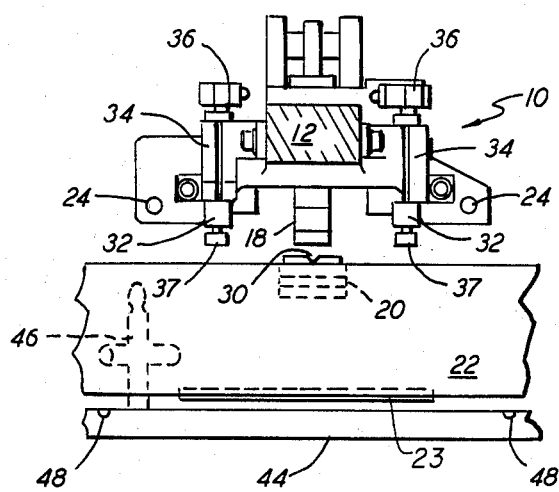
FIG. 3 is a transverse sectional view taken along the line indicated at 3—3 in FIG. 1.

With reference to the drawings, a new and improved chuck handling device is illustrated as indicated generally at 10, which comprises a main body 12 having a front side indicated at 14, FIG. 2, and a rear side indicated at 16. Latch means 18, FIGS. 1 and 3, are mounted on the front side of the main body 12, which engage a latch pin 20 carried by a wafer chuck assembly 22, FIGS. 2 and 3. A wafer 23 is mounted on the chuck assembly, as indicated in FIGS. 2 and 3. For alignment purposes the main body 12 carries a pair of alignment pins 24 which engage a corresponding V-groove 26, FIG. 2, in the wafer chuck assembly 22. A third alignment pin 28 is carried by the main body 12 which engages a corresponding V-groove 30, FIG. 2 and FIG. 3, in the wafer chuck assembly 22.

A pair of piston and cylinder assemblies 32 are mounted on the front side of the main body 12, as by means of clamp brackets 34 provided for the purposes. Hose fittings 36 mounted on the rear side of the assembly serve to apply fluid pressure to actuate the pistons. Pressure to each piston is individually controlled so that the force of the two pistons against the wafer chuck assembly 22 can be equalized and maintained at the minimum necessary amount. Plastic protective caps 37 are mounted on the ends of the pistons for purposes of preventing chips or other contaminants from getting on the wafer.

It would be appreciated that heretofore rigid pushers were employed for this task. These pushers were formed as a separate individual assembly which included two spaced pusher elements mounted at the end of level arms. The arms were mounted for pivotal movement above the latch mechanism. Such pusher assemblies had a number of disadvantages. They were of substantial mass and mounted at the end of relatively long lever arms, thereby having substantial inertia. It was difficult to prevent them from getting out of alignment whereby one pusher exerted greater force than the other pusher. These prior art systems were more time consuming in operation because all of the long rigid pusher action had to be completed prior to movement of the carriage arm, thereby lowering the throughput of the overall system.

As best seen in FIG. 1 a cam roller 38 is mounted on the lower front side of the main body 12 for facilitating pivotal movement of the device. A ball bearing 40, FIG. 2, is mounted on the lower rear side of the main body 12 for facilitating horizontal movement of the device. Still referring to FIG. 2 a downwardly extending alignment arm 42 facilitates vertical positioning of the device with respect to the chuck assembly 22.

In operation, the invention provides in one form thereof a method of applying and holding a wafer chuck assembly against an X, Y, $\theta$0 alignment plate, indicated at 44, comprising the steps of latching the wafer chuck assembly 22 with the chuck handling device 10 while inserting the three alignment pins, 24, 28 into the corresponding V-grooves 26, 30 in the chuck assembly 22 to form a rigid unit. The next step in the operation is to mount the unit on three pins 46 extending from the X, Y, $\theta$ alignment plate 44. Then the latching is released to allow the chuck assembly 22 to fall downwardly a short distance until it rests on the X, Y, $\theta$ pins. At this time air pressure is applied to the cylinder and the two pistons 32 extend from the chuck handling device 10, applying equal pressure to the wafer chuck assembly 22, thereby to urge the wafer 23 and the chuck assemby snugly against the X, Y, $\theta$ alignment plate 44. A vacuum is established in vacuum grooves 48 in the plate 44, and when this if firmly established and securely holds the chuck assembly, the air pressure is released in the cylinders and the pistons retract to their initial positions. The wafer chuck assembly and the X, Y, $\theta$ alignment plate together are passed on to the next work station in the microlithography system. Upon completion of the processing at all of the other work stations, the wafer chuck assembly and the X, Y, $\theta$ alignment plate are returned to their positions adjacent the chuck handling device 10. At this time the vacuum is released on the grooves 48 in the X, Y, $\theta$ alignment plate, and the wafer chuck assembly rests on the X, Y, $\theta$ plate pins 46. Then, the latch 18 on the chuck handling device 10 engages the latch pin 20 and lifts the wafer chuck assembly 22 to disengage the X, Y, $\theta$ plate pins 46 and engage the chuck handling device pins 24, 28. Finally, the wafer chuck assembly is removed from the X, Y, $\theta$ plate.

It will thus be seen that the present invention does indeed provide a new and improved chuck handling device which is superior to such devices employed heretofore.

Although specific embodiments have been illustrated and described, it will be obvious to those skilled in the art that various modifications my be made without departing from the spirit and scope of the invention, which is to be limited solely by the appended claims.

What is claimed is:

1. In a microlithography system, a method of applying and holding a wafer chuck assembly against an X, Y, $\theta$ alignment plate comprising the steps of:
   latching a wafer chuck assembly with a chuck handling device while inserting alignment pins carried by the device into corresponding V-like grooves in said chuck assembly to form a rigid unit;
   mounting said unit on pins extending from an X, Y, $\theta$ alignment plate;
   releasing said latching to allow said chuck assembly to fall downwardly a short distance until it rests on said X, Y, $\theta$ pins; and
   extending two pistons from said chuck handling device to engage said wafer chuck assembly to urge it snugly against said X, Y, $\theta$ alignment plate until said chuck assembly and alignment plate are locked together by vacuum means.

2. A method according to claim 1 wherein there are three spaced pins carried by said chuck handling device and three spaced pins carried by said X, Y, $\theta$ alignment plate.

3. In a microlithography system having a wafer chuck assembly for holding a wafer while it is being processed, a chuck handling device comprising:
   a main body having a front side and a rear side;
   latch means mounted on the front side of said main body for latching said wafer chuck assembly;
   pin means extending from the front side of said main body for engaging corresponding grooves in said wafer chuck assembly; and
   a pair of piston and cylinder assemblies, means mounting said assemblies, in spaced relationship with respect to each other, for extension from said front side to engage said wafer chuck assembly with a precision, repeatable force.

4. A chuck handling device according to claim 3 wherein there are three spaced pins extending from the front side of said main body.

5. A chuck handling according to claim 3 further comprising a cam roller mounted on the front side of said main body for facilitating pivotal movement of the device.

6. A chuck handling device according to claim 3 further comprising a ball bearing mounted on the lower rear side of the main body for facilitating horizontal movement of the device.

7. A chuck handling device according to claim 3 further comprising a downwardly extending alignment arm for facilitating vertical positioning of the device with respect to said chuck assembly.

* * * * *